United States Patent [19]

Manley

[11] Patent Number: 5,993,613
[45] Date of Patent: Nov. 30, 1999

[54] METHOD AND APPARATUS FOR PERIODIC POLARITY REVERSAL DURING AN ACTIVE STATE

[75] Inventor: Barry W. Manley, Boulder, Colo.

[73] Assignee: Sierra Applied Sciences, Inc., Boulder, Colo.

[21] Appl. No.: 08/966,049

[22] Filed: Nov. 7, 1997

[51] Int. Cl.$^6$ .................................................. C23C 14/34
[52] U.S. Cl. ................................ 204/192.12; 204/298.08
[58] Field of Search .................... 204/192.12, 192.15, 204/298.08, 298.38; 156/345

[56] References Cited

U.S. PATENT DOCUMENTS

| | | |
|---|---|---|
| 4,103,324 | 7/1978 | Vandervelen et al. . |
| 4,434,037 | 2/1984 | Crank .................................. 204/192.12 |
| 4,846,920 | 7/1989 | Keller et al. ........................ 204/192.33 |
| 4,931,169 | 6/1990 | Scherer et al. . |
| 4,936,960 | 6/1990 | Siefkes et al. . |
| 4,963,238 | 10/1990 | Siefkes et al. . |
| 4,981,566 | 1/1991 | Wurczinger . |
| 5,006,213 | 4/1991 | Sichmann et al. . |
| 5,009,764 | 4/1991 | Siefkes et al. . |
| 5,074,984 | 12/1991 | Sichmann et al. . |
| 5,108,571 | 4/1992 | Ludwig et al. . |
| 5,126,033 | 6/1992 | Szczyrbowski et al. . |
| 5,192,894 | 3/1993 | Teschner . |
| 5,286,360 | 2/1994 | Szczyrbowski et al. ........... 204/298.08 |
| 5,427,669 | 6/1995 | Drummond . |
| 5,584,974 | 12/1996 | Sellers ................................. 204/192.13 |
| 5,660,700 | 8/1997 | Shimizu et al. ..................... 204/298.08 |

FOREIGN PATENT DOCUMENTS

| | | |
|---|---|---|
| 0553410 A1 | 8/1993 | European Pat. Off. . |
| 221202 A1 | 4/1985 | Germany . |
| 229160 A1 | 10/1985 | Germany . |
| 3919147 A1 | 12/1990 | Germany . |
| 3121389 A1 | 8/1992 | Germany . |
| 4113704 A1 | 10/1992 | Germany . |
| 57-69324 | 4/1982 | Japan . |
| 61-30665 | 2/1986 | Japan . |
| 63-190168 | 8/1988 | Japan . |
| 2-61368 | 3/1991 | Japan . |
| 3-56671 | 3/1991 | Japan . |
| 2045553 | 3/1980 | United Kingdom . |

OTHER PUBLICATIONS

Beisswenger, T. et al., "Economical Considerations on Modern Web Sputtering Technology", Society of Vacuum Coaters, 35th Annual Technical Coinferece Proceedings, pp. 128–134 (1992).

Anderson, L., "A New Technique for Arc Control in DC Sputtering", Society of Vacuum Coaters, 35th Annual technical Conference Proceedings, pp. 325–329 (1992).

Schatz, Doug, "The MDX as a Strategic Tool in reducing Arcing", Application Notes, Advanced Energy Industries, Inc. (1985).

*Primary Examiner*—Nam Nguyen
*Assistant Examiner*—Gregg Cantelmo
*Attorney, Agent, or Firm*—Pruce E. Dahl, Esq.; Dahl & Osterloth, LLP.

[57] ABSTRACT

Apparatus for depositing a film of material on a substrate may comprise sputter deposition apparatus for transferring target atoms from a target to the substrate and a servo control circuit operatively associated with the sputter deposition apparatus. The servo control circuit operates the sputter deposition apparatus in an alternating manner between an "active" state and a "quiescent" state so that a power density on the target during the "active" state is at least about 400 watts per square inch of target area. During the active state, target atoms are transferred from the target to the substrate. During the quiescent state, substantially no target atoms are transferred from the target to the substrate. A polarity reversing circuit operatively associated with the servo control circuit periodically reverses a polarity on the sputter deposition apparatus during the "active" state.

17 Claims, 7 Drawing Sheets

METHOD AND APPARATUS FOR PERIODIC POLARITY REVERSAL DURING AN ACTIVE STATE

FIELD OF INVENTION

The present invention relates to power supplies in general and more specifically to power supplies for plasma processing systems.

BACKGROUND

Plasma deposition refers to any of a wide variety of processes in which a plasma is used to assist in the deposition of thin films or coatings onto the surfaces of objects. For example, plasma deposition processes are widely used in the electronics industry to fabricate integrated circuits and other electronic devices, as well as to fabricate the magnetic tapes and disks used in audio, video, and computer applications. Plasma deposition processes may also be used to apply coatings to various objects to improve or change the properties of the objects. For example, plasma deposition processes may be used to apply wear resistant coatings to machine tools, while other types of coatings may be used to increase the corrosion resistance of other items, such as bearings, turbine blades, etc, thereby enhancing their performance. In still other applications, plasma deposition may be used to apply coatings to various types of surfaces in the optics and glass industries.

In most plasma deposition processes the plasma is created by subjecting a low-pressure process gas (e.g., argon) contained within a vacuum chamber to an electric field. The electric field, which is typically created between two electrodes, ionizes the process gas, creating the plasma. If direct current (DC) is used to produce the electric field, the negatively charged electrode is usually referred to as the cathode, whereas the positively charged electrode is referred to as the anode. Thus, in the case of a DC sputter deposition plasma process, the material to be deposited on the object or substrate is usually connected as the cathode, whereas some other element, typically the vacuum chamber itself, is connected as the anode. Ionized process gas atoms comprising the plasma are accelerated toward the negatively charged cathode which also includes a target containing the material to be deposited on the substrate. The process gas atoms ultimately impact the target material and dislodge or sputter atoms from the target, whereupon the sputtered atoms subsequently condense on various items in the chamber, including the substrate that is to be coated. The substrate is usually positioned with respect to the target so that a majority of the sputtered target atoms condense onto the surface of the substrate.

While sputter deposition processes of the type described above may be used to deposit a wide variety of metals and metal alloys onto various substrates, they may be used to deposit compound materials as well. Reactive sputter deposition is the name usually given to sputtering processes which involve the sputtering of the target in the presence of a reactive species (e.g., oxygen or nitrogen gas) in order to deposit a film comprising the sputtered target material and the reactive species. A wide variety of compounds, such as $SiO_2$, $Al_2O_3$, $Si_3N_4$, and TiO, can be deposited by reactive sputter deposition processes.

The film deposited by such plasma deposition processes may be characterized by certain properties, such as adhesion; stress (i.e., compressive or tensile); stoichiometry; microstructure, including morphology, grain size, grain orientation, and epitaxy; hardness; abrasion resistance; density; as well as overall film thickness, just to name a few. Certain of these properties or characteristics may be of greater or lesser importance depending on the particular film and the type of application.

Unfortunately, while sputter deposition apparatus of the type described above are relatively easy to operate in a basic sense, the problem of operating sputter deposition apparatus to produce high quality films having the desired characteristics and properties on a repeatable basis is by no means trivial. Indeed, a significant portion of the current research efforts in sputter deposition technology are directed to developments and refinements of the sputter deposition apparatus and methods in order to improve the qualities of the deposited films.

While much remains to be learned about the mechanisms associated with film growth and the production of films having certain characteristics, certain mechanisms have been discovered that have predictable effects on film properties. For example, it has been found that the irradiation of the growing film with ions strongly affects film nucleation and growth, adhesion, film microstructure, and chemistry. Accordingly, many sputter deposition apparatus have been provided with separate ion sources (e.g., ion beams) to produce surface coatings having the desired properties. Unfortunately, however, the ion beam produced by a typical ion source is relatively small, typically a few millimeters in diameter, which limits the use of ion beam sputtering to applications involving like-sized substrates.

Partly in an effort to solve this problem, some operators have replaced the conventional narrow beam ion sources with ion thrusters of the type developed for space propulsion systems. Such ion thruster devices generally produce ion beams having relatively large cross sections, on the order of tens of millimeters, which allows larger substrates to be coated with the ion beam sputtering process. Unfortunately, problems still remain with regard to the maximum size of the substrate that may be effectively coated with such ion beam sputtering processes. Also, the provision to the sputtering system of an additional component (i.e., the ion beam source), increases the overall complexity of the system and may cause other problems.

Another method for controlling certain film properties that has been used with some degree of success is bias sputtering. In bias sputtering, the substrate is biased negatively with respect to the plasma potential. The negatively biased substrate attracts ions from the plasma, thereby providing low-energy ion bombardment of the growing film. With proper control of the low-energy ions, bias sputtering process may be used to achieve or control certain film properties. Unfortunately, however, bias sputtering is also not without its problems and limitations. For example, bias sputtering techniques cannot be used if the substrate is an electrical insulator. Also, the sputter deposition system must be provided with apparatus suitable for controlling the charge placed on the substrate to ensure that the ions bombard the substrate at the proper energy levels.

In summary, while the ion beam and bias sputtering processes described above are useful in certain applications, a need still exists for a film deposition system that will provide for the convenient control of certain specified film properties. Ideally, such a film deposition system should provide the operator with the desired degree of control of the specified film properties but without the need to resort to separate ion sources, with all their associated complexities and shortcomings. Additional advantages could be achieved if the desired film properties could be realized without the need to bias the substrate, as is required in bias sputtering processes.

SUMMARY OF THE INVENTION

Apparatus for depositing a film of material on a substrate may comprise sputter deposition apparatus for transferring target atoms from a target to the substrate and a servo control circuit operatively associated with the sputter deposition apparatus. The servo control circuit operates the sputter deposition apparatus in an alternating manner between an "active" state and a "quiescent" state so that a power density on the target during the "active" state is at least about 400 watts per square inch of target area. During the active state, target atoms are transferred from the target to the substrate. During the quiescent state, substantially no target atoms are transferred from the target to the substrate. A polarity reversing circuit operatively associated with the servo control circuit periodically reverses a polarity on the sputter deposition apparatus during the "active" state.

Also disclosed is a method for depositing a film of material on a substrate which comprises the step of providing sputter deposition apparatus for transferring target atoms from a target to the substrate; operating the sputter deposition apparatus in an alternating manner between the active state and the quiescent state so that a power density applied to the target during the "active" state is at least about 400 watts per square inch of target area; and periodically reversing a polarity on the sputter deposition apparatus during the "active" state.

BRIEF DESCRIPTION OF THE DRAWINGS

Illustrative and presently preferred embodiments of the invention are shown in the accompanying drawings in which.

DETAILED DESCRIPTION OF THE INVENTION

Figure 1:
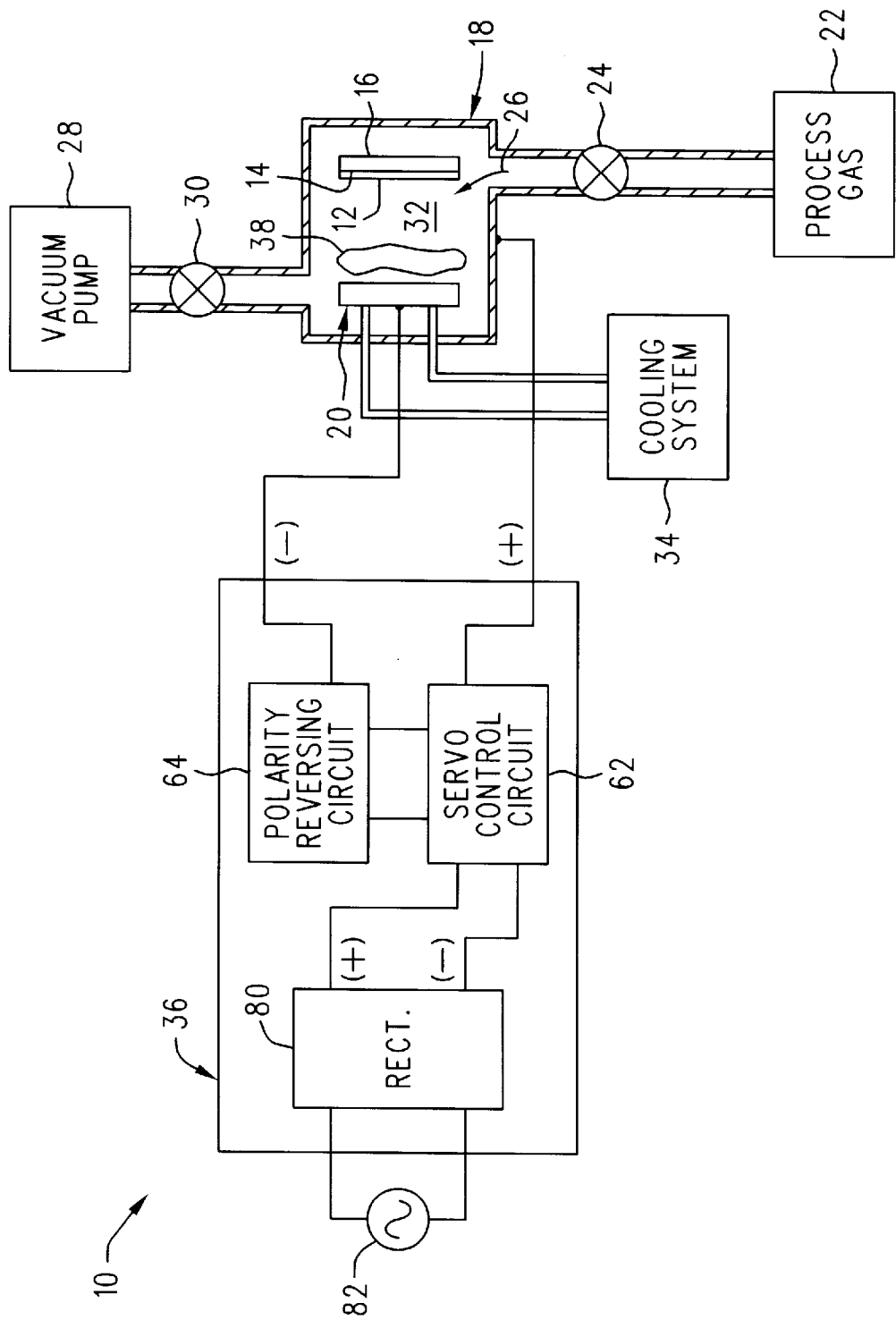
FIG. 1 is a schematic representation of one embodiment of a film deposition apparatus for accomplishing the film deposition method according to the present invention.

Film deposition apparatus 10 according to one preferred embodiment of the present invention is shown in FIG. 1 as it could be used to deposit a film 12 onto a surface 14 of a substrate 16 contained within a vacuum chamber 18. The material comprising the film 12 may be derived by sputtering a target 42 (FIGS. 2 and 3) associated with a cathode/target assembly 20. The cathode/target assembly 20 is connected to a negative (−) terminal of a power supply 36. A positive (+) terminal of power supply 36 may be connected to the vacuum chamber 18, in which case it serves as the anode.

As will be described in greater detail below, the power supply circuit 36 produces a modulated output signal 66 (FIG. 4) which alternately operates the sputter deposition apparatus (i.e., the cathode/target assembly 20) between an "active" state and a "quiescent" state. When the cathode/target assembly 20 is operated in the active state, material (not shown) is sputtered from the cathode/target assembly 20. The sputtered material subsequently condenses on the surface 14 of substrate 16, whereupon it forms the film 12. When operated in the quiescent state, substantially no material is sputtered from the cathode/target assembly 20 or is transferred to the substrate 16. Operating the sputter deposition apparatus (i.e., the cathode/target assembly 20) in such an alternating manner (i.e., between the "active" state and the "quiescent" state) provides for improved control of certain film properties, as will be described in greater detail below.

The vacuum chamber 18 may comprise a generally closed, gas-tight chamber to which are connected a variety of ancillary systems and devices that may be necessary or desirable in order to perform the desired plasma process. For example, in one preferred embodiment, the vacuum chamber 18 may include a process gas supply 22 which contains a supply of a suitable process gas (indicated by arrow 26). The process gas supply 22 may be connected to the vacuum chamber 18 via a process gas valve 24 which regulates the flow of the process gas 26 into the interior 32 of chamber 18. The vacuum chamber 18 may also include a vacuum pump assembly 28 and a vacuum valve assembly 30 to maintain the interior 32 of the vacuum chamber 18 at a pressure suitable for carrying out the desired process. A cooling system 34 may also be provided to cool the cathode/target assembly 20 and/or the vacuum chamber 18. Finally, if reactive sputtering processes are to be performed, the vacuum chamber 18 may also be provided with a supply of a suitable reactive gas (not shown), along with the appropriate devices (e.g., valves, regulators, etc., also not shown) for introducing the appropriate quantity of reactive gas into the process chamber 18.

As was mentioned above, the cathode/target assembly 20 provides the material that will be ultimately deposited as the film 12. Specifically, the material originates from a separate target 42 that is associated with the cathode/target assembly 20. See FIGS. 2 and 3. If non-reactive sputtering processes are to be performed, then the cathode/target assembly 20 will be operated in the absence of a reactive material (e.g., a reactive gas). Alternatively, if reactive sputtering processes are to be performed, then the cathode/target assembly 20 will usually be operated in the presence of a reactive material in order to produce a compound film comprising the material sputtered from the target and the reactive species.

Figure 2:
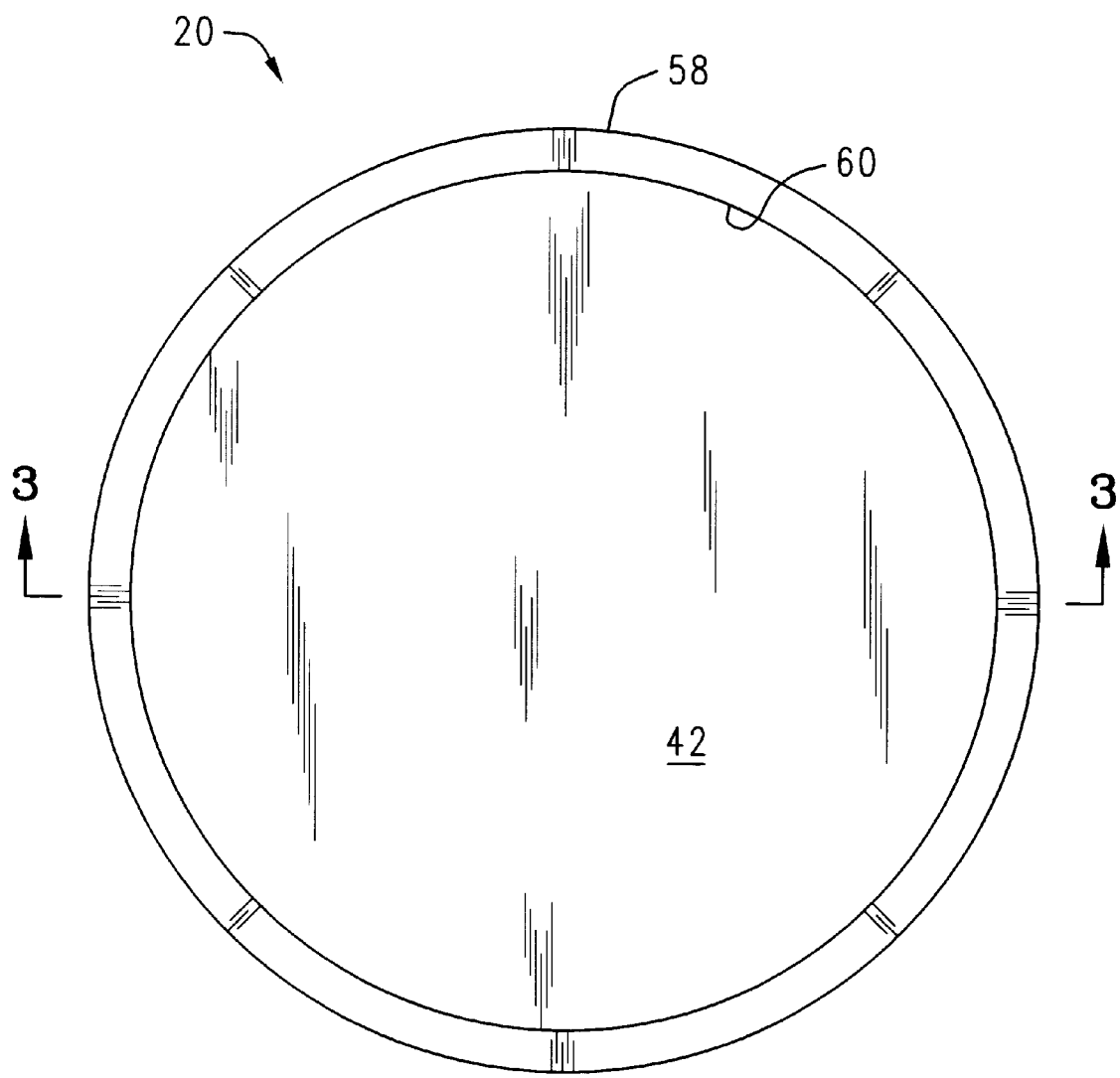
FIG. 2 is a plan view of a circular cathode/target assembly that may be used in one preferred embodiment of the invention.
Figure 3:
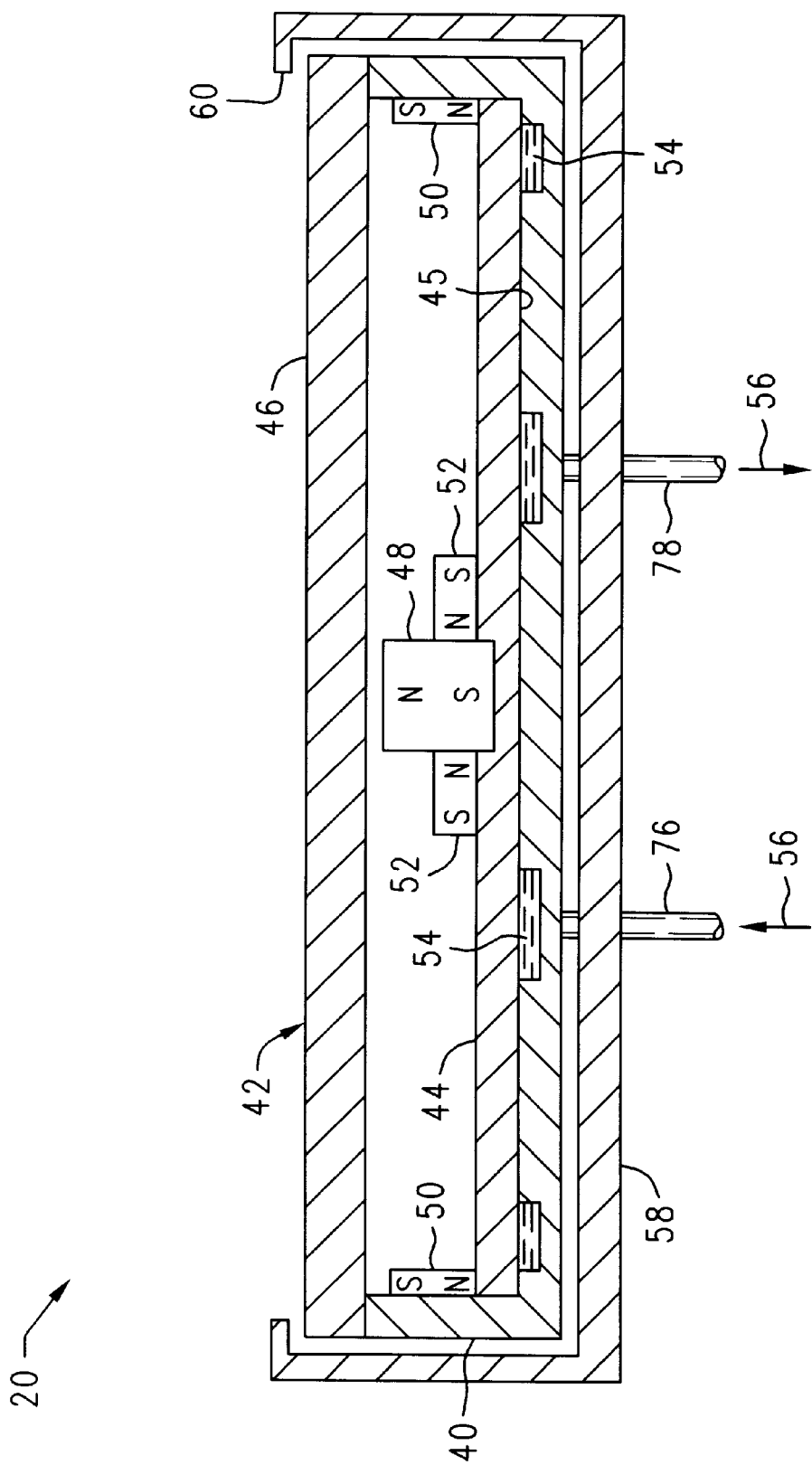
FIG. 3 is a sectional view in elevation of the circular cathode/target assembly taken along the line 3—3 of FIG. 2.

Regardless of whether the cathode/target assembly 20 is used to accomplish non-reactive or reactive sputtering, the cathode/target assembly 20 may comprise a conventional magnetron sputtering "source" of the planar type. Alternatively, the cathode/target assembly could comprise other types of sources, such as non-planar magnetrons, or even non-magnetron (i.e., diode) sources. Referring now to FIGS. 2 and 3, the cathode/target assembly 20 that is used in one preferred embodiment may comprise a planar magnetron having a backing plate 40 to which is mounted a generally circular target member 42. A pole piece 44 may also be also mounted to the backing plate 40, generally between the backing plate 40 and the target 42. Pole piece 44 may include a plurality of magnets 48, 50, and 52 which produce a closed loop magnetic field (not shown) over the front surface 46 of target 42. The closed-loop magnetic field confines the electrons over the front surface 46 of target 42, which generally increases the ionization of the process gas and improves the sputtering rate and overall target utilization.

The power supply 36 produces the modulated output signal 66 (FIGS. 4 and 5) which is then applied to the cathode/target assembly 20. The modulated output signal 66 operates the sputter deposition apparatus (i.e., the cathode/target assembly 20) in an alternating manner between the active state and the quiescent state. The power supply 36 may include a rectifier circuit 80 for rectifying or converting alternating current (i.e., AC) from an AC source 82 to a direct current (i.e., DC). A servo control circuit 62 connected to the direct current terminals (i.e., the (+) and (−) terminals) of the rectifier circuit 80 modulates the DC current produced by the rectifier circuit 80 to produce the modulated output signal 66 (FIG. 4), which may then be applied directly to the cathode/target assembly 20. The power supply circuit 36 is also provided with a polarity reversing circuit 64 which superimposes onto the modulated output signal 66 a plurality of polarity reversal signals 86, as best seen in FIG. 5. The polarity reversal signals 86 briefly reverse the polarity on the cathode/target assembly 20, thereby discouraging the formation of arcs within the chamber 18.

Figure 4:
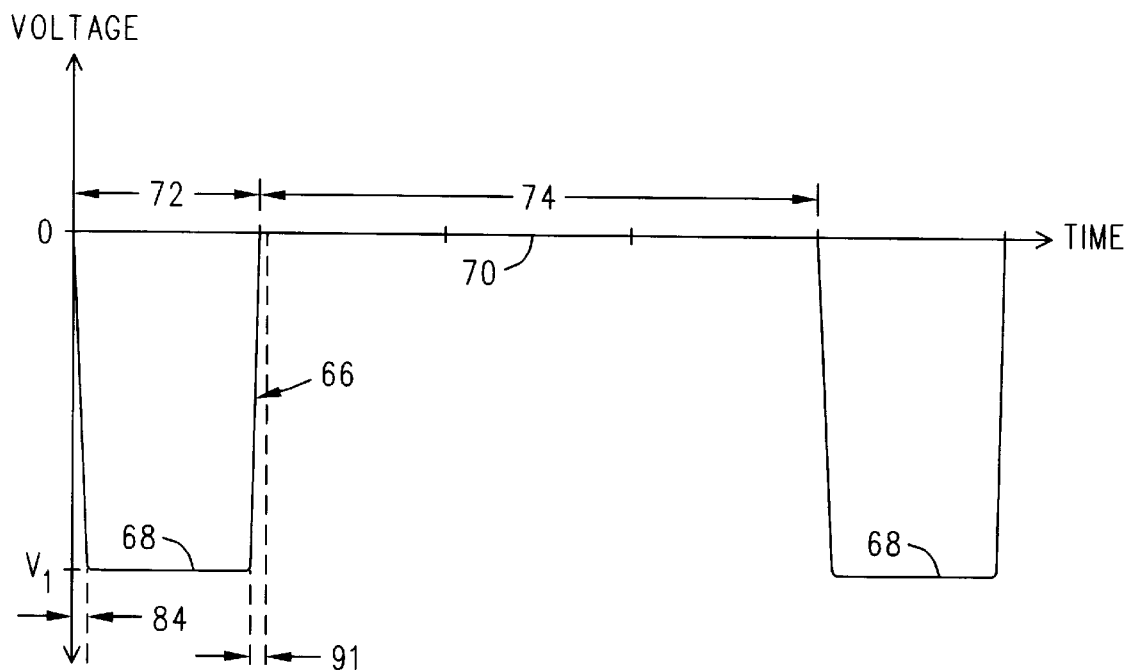
FIG. 4 is a graphical representation of the modulated output signal produced by the power supply.
Figure 5:
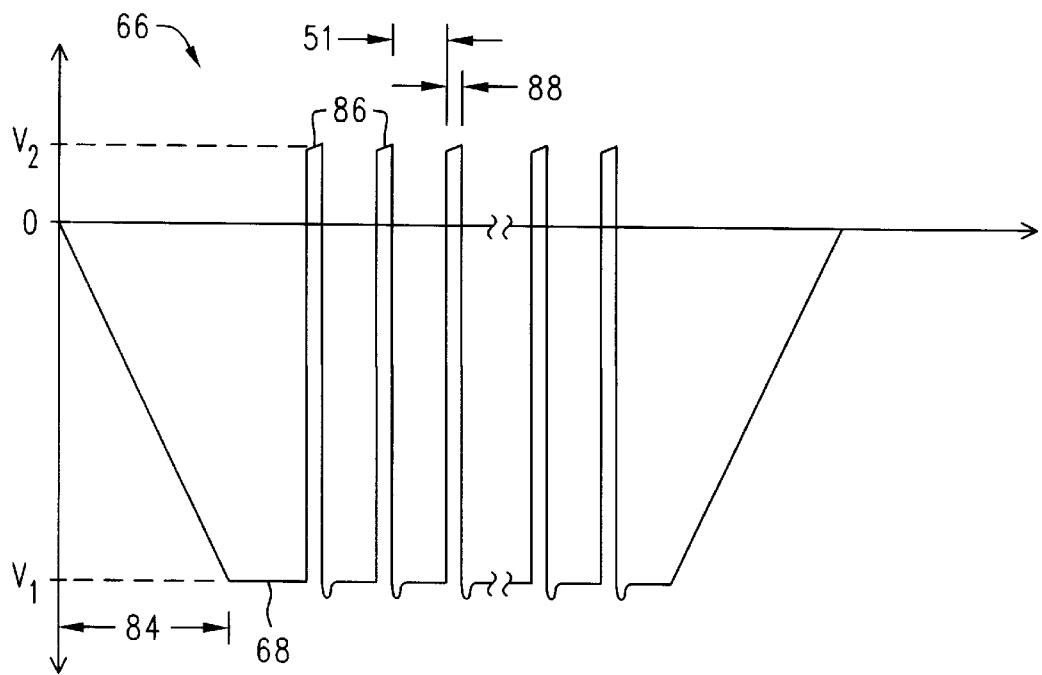
FIG. 5 is a graphical representation of the modulated output signal having a plurality of optional polarity reversal signals imposed thereon.

Referring now primarily to FIG. 4, the modulated output signal 66 comprises a periodic signal having a plurality of negative periods or pulses 68 each of which is separated by a quiescent period 70. When the modulated output signal 66 is applied to the cathode/target assembly 20, material will be sputtered from the cathode/target assembly 20 during the negative period 68, but will not be sputtered during the quiescent period 70. Put in other words, the modulated output signal 66 produced by the power supply assembly 36 alternates the state of operation of the cathode/target assembly 20 between the active state and the quiescent state.

The modulated output signal 66 comprises several significant parameters that are of importance in achieving the objects and advantages of the present invention. One significant parameter is the "turn-on" time 84, i.e., the time required for the voltage to reach substantially the operational voltage $V_1$. Another significant parameter is the "turn-off" time 91, i.e., the time required for the voltage to reach substantially the quiescent or zero voltage point. Also of importance are the durations of both the negative pulse (i.e., period 68) and the quiescent period 70. In one preferred embodiment, the turn-on time 84 may be in the range of about 5 microseconds ($\mu$s) to 200 $\mu$s (<30 $\mu$s preferred). The turn-off time 91 may also be in the range of about 5 $\mu$s to 200 $\mu$s (<30 $\mu$s preferred). The duration 72 of the negative pulse 68 may be in the range of about 0.5 milliseconds (ms) to 10 ms (1–2 ms preferred), whereas the duration 74 of the quiescent period 70 may be in the range of about 0.5 milliseconds (ms) to 50 ms (5–10 ms preferred).

The polarity reversing circuit 64 superimposes on the modulated output signal 66 a plurality of short duration polarity reversal signals 86, as best seen in FIG. 5. The polarity reversal signals 86 are provided during the negative period 68 of the modulated output signal 66 (i.e., during the "active" state). Note that the duration 88 of each polarity reversal signal is considerably shorter than the duration of the negative pulse 68. Consequently, each negative pulse period 68 may comprise a large number of polarity reversal signals 86. The advantages associated with the polarity reversal signals 86 will be described in greater detail below.

The film deposition apparatus 10 according to the present invention may be operated as follows to deposit the film 12 onto the surface 14 of substrate 16. Assuming that proper pressure and atmosphere have been established within the chamber 18, the sputter deposition process (i.e., either non-reactive or reactive) may be initiated by activating the power supply 36. Thereafter, the power supply 36 places the modulated output signal 66 on the cathode/target assembly 20. During the negative pulse or period 68, an electric field is established between the cathode/target assembly 20 and the anode (e.g., chamber 18) which initiates or "ignites" the glow discharge (i.e., the plasma 38). The plasma 38 causes sputtering of the target portion 42 of the cathode/target assembly 20. That is, atoms (not shown) sputtered from the target 42 are released into the interior 32 of chamber 18, whereupon a portion of the sputtered atoms subsequently condense on the surface 14 of substrate 16, thereby forming the film 12. When the modulated output signal 66 enters the quiescent period 70, the plasma 32 is extinguished, which terminates the sputtering process. Consequently, substantially no material is transferred from the target 42 to the substrate 16 during the quiescent period 70.

While no significant activity occurs on the cathode/target 20 during the quiescent period 70 (at least insofar as the properties of the film 12 are concerned), the same cannot be said with regard to the surface 14 of substrate 16. During the quiescent period, previously deposited atoms (i.e., adatoms) of the target material may be rearranging themselves on the surface 14 of substrate 16. This phenomenon is referred to herein as "surface mobility." The alternating sputtering process according to the present invention significantly increases the surface mobilities of the deposited adatoms over those which would be associated with the same sputtering apparatus but operating in a continuous manner, i.e., without a quiescent period 70.

The increased surface mobilities of the adatoms are due primarily to two factors. The first factor is the quiescent period 70. Essentially, the quiescent period 70 provides the adatoms with additional time to migrate over the surface 14 of substrate 16. Therefore, even though the adatoms may possess substantially the same energies as those which would be associated with the same apparatus but operating without a quiescent period 70, the additional migration time afforded by the quiescent period 70 means that the adatoms will generally have greater surface mobilities. Moreover, even relatively low-energy adatoms may have significantly greater surface mobilities due to the additional migration time afforded by the quiescent period 70.

The second factor that tends to increase the surface mobilities of the adatoms is that the deposited adatoms themselves may have relatively high energies. For example, the present invention will generally allow the target to be sputtered at much higher power levels (e.g., at least about 400 watts/in$^2$ of target surface area) during the active state, but without sacrificing process control, as will be described in greater detail below. Such higher power levels provide the incoming adatoms with correspondingly higher energies which generally increases their surface mobilities.

The increased adatom mobility provided by the quiescent period 70 and the increased adatom energies associated with the present invention provides several distinct advantages and may be used to enhance and control many film properties, including microstructure, density, adhesion, and chemistry. For example, the increased adatom mobility generally allows more adatoms to migrate to low energy sites where nucleation and growth occurs, thereby increasing the nucleation density in many instances. The increased nucleation density may promote more interfacial reactions and allow for the deposition of adherent films on substrates where normally the adhesion of the film is poor.

The increased mobility may also result in improved film morphology. For example, prior to this invention, the use of high material deposition rates typically resulted in amorphous films having low density, columnar microstructures. It is generally believed that the formation of such columnar microstructures is due in large part to the fact that the adatoms do not have sufficient time to diffuse across the surface and find low energy sites before being buried by subsequently deposited adatoms. The present invention solves this problem by periodically operating the sputter deposition apparatus in the quiescent state to allow the adatoms additional time to migrate to low energy sites before being covered by subsequently deposited adatoms. Consequently, films produced by the present invention tend to have improved surface coverage with a consequent reduction in the number of interfacial voids which may result in the easy fracture and poor adhesion of the film. Such increased film density may be reflected in film properties such as better corrosion resistance, lower chemical etch rate, higher hardness, lower electrical resistivity (in metals), and increased index of refraction for optical coatings.

Yet another advantage associated with the present invention is that the increased energies and mobilities of the adatoms results in improved "step coverage" of surfaces that are oblique, or even normal to, the incoming adatoms. Such improved step coverage provides for significant advantages in the processing of electronic components and integrated circuits, just to name a few.

Still yet another advantage of the present invention is that the high surface mobilities of the adatoms does not come at the expense of effective control of other film properties, such as film thickness. For example, while prior to this invention high power levels could be used to achieve high deposition rates, thus achieve high material throughput, it proved difficult to precisely control the film thickness. Indeed, in many applications where film thickness was a critical parameter it was not uncommon to reduce the power level, thus deposition rate, of such devices in order to achieve a satisfactory degree of control over film thickness. The present invention, by providing for relatively fast switching between the active and quiescent states, allows the process to be immediately terminated once the film has reached the desired thickness.

Still other advantages are associated with the film deposition apparatus 10 according to the present invention when used to perform reactive sputtering. For example, in addition to increasing the surface mobilities of the deposited adatoms, the quiescent period 70 also allows for the improved diffusion of the reactive species adjacent the substrate surface 14. The quiescent period 70 also provides additional reaction time. The improved diffusion and reaction time tends to enhance the film chemistry and other properties of the deposited compound film.

Having briefly described the film deposition apparatus 10 and method of using the same, as well as some of its more significant features and advantages, the preferred embodiments of the film deposition apparatus and method according to the present invention will now be described in detail.

Referring back now to FIG. 1, the film deposition apparatus 10 according to one preferred embodiment of the present invention is shown and described herein as it may be used to perform non-reactive sputter deposition to deposit a film 12 onto the surface 14 of an object or substrate 16. Alternatively, the film deposition apparatus 10 could be used to perform reactive sputter deposition, as will be described in greater detail below. In either case, the sputtered material may be provided by a suitable sputter deposition apparatus that is alternately operated between an "active" state and a "quiescent" state. Accordingly, as used herein, the term "sputter deposition apparatus" refers to apparatus that includes a process chamber (e.g., vacuum chamber 18), a sputtering source (e.g., cathode/target 20), an anode (e.g., vacuum chamber 18), as well as any associated systems and devices required for either non-reactive or reactive sputter deposition (e.g., process gas supply 22, vacuum pumping system 28, etc).

In accordance with its use in non-reactive sputter deposition, the process or vacuum chamber 18 utilized in one preferred embodiment may include a process gas supply 22 which contains a supply of a suitable process gas (e.g., argon, although other gases may also be used). A process gas valve 24 connected between the process gas supply 22 and the vacuum chamber 18 may be used to control the flow of process gas (arrow 26) into the interior 32 of chamber 18. Vacuum chamber 18 may also include a vacuum pumping system 28 and a vacuum valve assembly 30 to maintain the interior region 32 of the vacuum chamber 18 at a pressure suitable for carrying out the desired process. For example, in most magnetron sputter deposition processes it is usually desirable to maintain the interior 32 of the process chamber 18 at or below a pressure of about 1 milliTorr (mTorr), although other pressures could also be used depending on the type of process being performed and on other extrinsic factors.

It should be noted that process chambers (e.g., vacuum chamber 18), as well as the various ancillary devices and systems (e.g., process gas supply systems, pumping systems, etc.) associated therewith, are also well-known in the art and could be easily provided by persons having ordinary skill in the art after having become familiar with the teachings of the present invention. Therefore, the particular process chamber 18 and related ancillary systems and devices utilized in one preferred embodiment of the invention will not be described in further detail.

If it is desired to configure the film deposition apparatus 10 to accomplish reactive sputter deposition, the process chamber 18 may also be provided with a reactant gas source (not shown) that contains a supply of a suitable reactant gas. Examples of suitable reactant gases include, but are not limited to, oxygen ($O_2$), nitrogen ($N_2$), and hydrogen sulfide ($H_2S$). The reactant gas source (not shown) may also include a valve assembly (also not shown) to regulate the flow of the reactant gas into the interior 32 of process chamber 18. However, since such additional systems and devices required to accomplish reactive sputter deposition are well-known in the art and could be easily provided by persons having ordinary skill in the art after having become familiar with the present invention, the additional systems and devices that may be required or desired to accomplish reactive sputter deposition also will not be described in further detail herein.

The cathode/target assembly 20 utilized in one preferred embodiment of the present invention is best seen in FIGS. 2 and 3 and may comprise a planar magnetron cathode/target assembly of the type shown and described in U.S. Pat. No. 5,262,028, which is incorporated herein by reference for all that it discloses. Alternatively, other types of cathode/target assemblies, such as non-planar magnetrons or even regular (i.e., non-magnetron) diode sources, could also be used. Therefore, the present invention should not be regarded as limited to the cathode/target assembly 20 shown and described herein.

The circular cathode/target assembly 20 used in one preferred embodiment and described in U.S. Pat. No. 5,262, 028 will now be briefly described. Referring now to FIGS. 2 and 3, the circular cathode/target assembly 20 may comprise a generally circular pole piece member 44 which supports a plurality of permanent magnets 48, 50, and 52. Specifically, pole piece 44 supports an inner magnet 48, a plurality of outer magnets 50, and a plurality of intermediate magnets 52. The north poles (N) and south poles (S) of the inner and outer magnets 48 and 50 are generally "vertically" oriented and may have the polarities indicated in FIG. 3. The intermediate magnets 52 may be positioned adjacent inner magnet 48 and may have their north poles (N) and south poles (S) oriented generally "horizontally" and may have the polarities shown. Alternatively, the various magnets 48, 50, and 52 may be positioned on the pole piece 44 so that they have opposite polarities.

In any event, the various magnets 48, 50, and 52 produce a plasma-confining magnetic field (not shown) over the front surface 46 of target 42. The magnetic field confines the electrons (also not shown) over the surface 46 of the target 42, which generally increases the ionization of the process gas and improves the sputtering rate and overall target utilization.

The magnets 48, 50, and 52 preferably comprise rareearth neodymium-iron-boron (NdFeB) magnets having magnetic field energy products of about 35 megagaussoersteds. However, other types of rare earth magnets, such as samarium cobalt (SmCo) magnets, may also be used. Good results can also be obtained with ceramic magnets, such as barium or strontium ferrite magnets, although their magnetic field energy products are generally lower. Alternatively, the magnets 48, 50, and 52 may comprise an electro-magnet or electromagnets.

It is generally preferred that the pole piece 44 comprise a ferromagnetic material, such as magnetic stainless steel. As used herein, the term "ferromagnetic" refers to those metals, alloys, and compounds of the transition (iron group) rareearth and actinide elements in which the internal magnetic moments spontaneously organize in a common direction, giving rise to a magnetic permeability considerably greater than that of vacuum and to magnetic hysteresis. Ferromagnetic materials may include, without limitation, iron, nickel, cobalt, and various alloys thereof.

The pole piece 44 may be mounted to a backing plate 40, which in turn supports the target material 42, as best seen in FIG. 3. The backing plate 40 may also include a plurality of coolant passages 54 therein for allowing a liquid coolant 56, such as water, to circulate adjacent the back surface 45 of pole piece 44. The various passages 54 in the backing plate 40 are connected to an inlet pipe 76 and an outlet pipe 78. The coolant 56 may be provided by a suitable cooling system 34, as best seen in FIG. 1. The coolant 56 is used to keep the various magnets 48, 50, and 52 from exceeding their respective Curie temperatures, i.e., from losing their magnetism. As used herein, the term "Curie temperature" refers to that temperature below which a magnetic material exhibits ferromagnetism and above which ferromagnetism is destroyed and the material is paramagnetic. The Curie temperature of a magnetic material may be different depending on whether the magnetic material is placed in a "closed loop" magnetic field or an "open loop" magnetic field. Generally speaking, the Curie temperature of a given magnetic material is lower when the material is in an open loop magnetic field.

The backing plate 40 may be made from a non-ferromagnetic material, preferably having good thermal conductivity. For example, in one preferred embodiment, the backing plate 40 comprises copper, although other materials could also be used.

The entire cathode/target assembly 20 may be surrounded by a shield assembly 58. The shield assembly 58 includes an aperture 60 which exposes the front surface 46 of target 42 to the interior 32 of the process chamber 18. The shield assembly 58 should be electrically isolated from the cathode/target assembly 20. Preferably, shield assembly 58 should be grounded. In one preferred embodiment, the shield assembly 58 may comprise a non-ferromagnetic material, such as type 304 stainless steel.

The power supply 36 produces the modulated output signal 66 (FIGS. 4 and 5) which is applied to the cathode/target assembly 20. The modulated output signal 66 comprises a periodic signal having a plurality of negative pulses or periods 68 each of which is separated from the others by a plurality of quiescent periods 70. When the modulated output signal 66 is applied to the cathode/target assembly 20, material from the target 42 will be sputtered during the negative period 68 but will not be sputtered during the quiescent period 70. Put in other words, the modulated output signal 66 produced by the power supply assembly 36 operates the cathode/target assembly 20 in an alternating manner between an "active" state and a "quiescent" state. During the active state, i.e., during the time when a negative voltage pulse 68 is applied to the cathode/target assembly 20, material is sputtered from the target 42 and is transferred from the target 42 to the substrate 16. During the quiescent state, substantially no sputtering of the target 42 occurs and substantially no material is transferred to the substrate 16.

The modulated output signal 66 comprises several significant parameters that are of importance in achieving the objects and advantages of the present invention. While the various significant parameters are described in detail below, the order in which they are described is not related to their importance and no single parameter should be regarded as of paramount importance in any particular application.

One significant parameter is the "turn-on" time 84. As used herein, the "turn-on" time 84 refers to the time required for the voltage on the cathode/target assembly 20 to decrease from substantially zero volts (e.g., ground potential) to about 90% of the steady-state operating voltage $V_1$ ($V_1$ being a negative voltage). Since the steady-state operating voltage $V_1$ can vary significantly depending on the target material, the strength of the plasma-confining magnetic field, the pressure in the process chamber 18, the nature of the process being performed, and other extrinsic factors, the steady-state operating voltage $V_1$ should not be regarded as being limited to any particular voltage or range of voltages. However, by way of example, the steady-state operating voltage $V_1$ in one preferred embodiment may be in the range of about −100 to −1,000 volts.

The turn-on time 84 should be made as fast as possible to promote effective control of the process being performed within the vacuum chamber 18. In one preferred embodiment, the turn-on time 84 may be in the range of about 5 microseconds ($\mu$s) to about 200 $\mu$s, with a turn-on time 84 less than about 30 $\mu$s being preferred. Since short turn-on times are advantageous, the shorter the turn-on time 84, the better. Accordingly, the critical limit on the turn-on time 84 is usually the high end of the range (i.e., corresponding to longer turn-on times 84). Therefore, it is preferred that the turn-on time 84 be no longer than about 200 microseconds ($\mu$s).

Another significant parameter is the "turn-off" time 91. As used herein, the "turn-off" time 91 refers to the time required for the voltage on the cathode/target assembly 20 to increase from substantially the steady-state operating voltage $V_1$ to the ground potential (e.g., zero volts). In one preferred embodiment, the turn-off time 91 is in the range of about 5 $\mu$s to 200 $\mu$s, with a turn-off time 91 less than about 30 $\mu$s being preferred.

Two other critical parameters are the duration 72 of the negative pulse 68 and the duration 74 of the quiescent period 70. For example, excessively long durations 72 of the negative pulse 68, while serving to increase the overall deposition rate, may tend to decrease the surface mobilities of the adatoms due to their becoming covered with additional incoming adatoms before they have sufficient time to migrate to low energy sites. Such decreased surface mobilities may well result in an increase in the number of interfacial voids and may lead to the formation of columnar morphologies, which are not generally preferred. Excessively long durations 74 of the quiescent period 70 tends to decrease the overall deposition rate which, again, may be undesirable in many applications.

In view of the foregoing considerations, then, the optimal trade-off between effective control of film properties and high effective deposition rates can usually be achieved if the duration 72 of the negative period 68 is between about 0.5 milliseconds (ms) and about 10 ms (1–2 ms preferred). The duration 74 of the quiescent period 70 should be between about 0.5 milliseconds (ms) and about 50 ms (5–10 ms preferred). However, these optimal durations may vary somewhat depending on the particular process, the material being deposited, and other extrinsic factors.

As was mentioned above, the power supply 36 includes a polarity reversing circuit 64 which superimposes upon the negative pulses 68 a plurality of polarity reversal signals 86, as best seen in FIG. 5. The polarity reversal signals 86 discourage the development of arc conditions within the chamber 18, thereby significantly reducing the occurrences of arcs, which can be deleterious to the process being performed in the chamber 18.

Referring now specifically to FIG. 5, each polarity reversal signal 86 may comprise a short duration period 88 wherein the voltage on the cathode/target assembly 20 is briefly made positive with respect to the anode (i.e., the chamber 18). That is, the voltage on the cathode/target assembly 20 is momentarily increased to a positive potential $V_2$ with respect to the anode. As was the case for the steady-state operating voltage $V_1$, the positive potential $V_2$ required to provide a satisfactory degree of arc suppression may vary depending on a wide variety of factors including, for example, the type of material being sputtered, the strength of the plasma confining magnetic field, the pressure in the process chamber, and the nature of the process being performed. Therefore, the positive potential $V_2$ should not be regarded as being limited to any particular voltage or range of voltages. However, by way of example, the positive potential $V_2$ may be in the range of about 20 volts to about 200 volts (100 volts preferred).

The duration 88 of each polarity reversal pulse 86 required to provide a satisfactory degree of arc suppression may also vary depending on a variety of extrinsic factors, such as the type of material being sputtered, the strength of the plasma confining magnetic field, and the pressure in the process chamber. In one preferred embodiment, the duration 88 of each polarity reversing pulse 86 may be in the range of about 2 microseconds ($\mu$s) to 5 $\mu$s (3 $\mu$s preferred) and the pulses 86 may occur at a frequency in the range of about 20 kilohertz (kHz) to about 80 kHz (30 kHz preferred). However, other durations 88 and frequencies may also be used, again depending on the particular material being sputtered, the pressure within the chamber, and other extrinsic factors.

One example of a power supply 36 suitable for producing the modulated output signal 66 is shown in FIGS. 1 and 6–9, and will be described below. However, other types of power supplies may be available now or in the future that may be capable of producing a modulated output signal 66 that meets the critical parameters discussed above. Accordingly, the present invention should not be regarded as limited to the particular power supply 36 shown and described herein.

Referring now to FIGS. 1 and 6–9, the power supply 36 used to produce the modulated output signal 66 may comprise a rectifier circuit 80 connected to a suitable supply of electrical power, such as an alternating current source 82. The rectifier circuit 80 converts the alternating current (AC) produced by the alternating current source 82 to a direct current (DC) suitable for use by the servo control circuit 62. As was mentioned above, the servo control circuit 62 produces the modulated output signal 66 that comprises a plurality of negative pulses 68 and quiescent periods 70. The power supply 36 is provided with a polarity reversing circuit 64 to generate a plurality of polarity reversing signals 86 which are then superimposed on each negative pulse 68 produced by the servo control circuit 62. See FIG. 5.

The servo control circuit 62 utilized in one preferred embodiment may comprise a servo control circuit of the type shown and described in U.S. patent application Ser. No. 08/966489 filed Nov. 7, 1997 now U.S. Pat. No. 5,910,866 published Jun. 10, 1999 and entitled "Phase-Shift Power Supply", which is incorporated by reference herein for all that it discloses. However, in order to provide a better basis for understanding the present invention, the servo control circuit 62 will now be briefly described.

Figure 6:
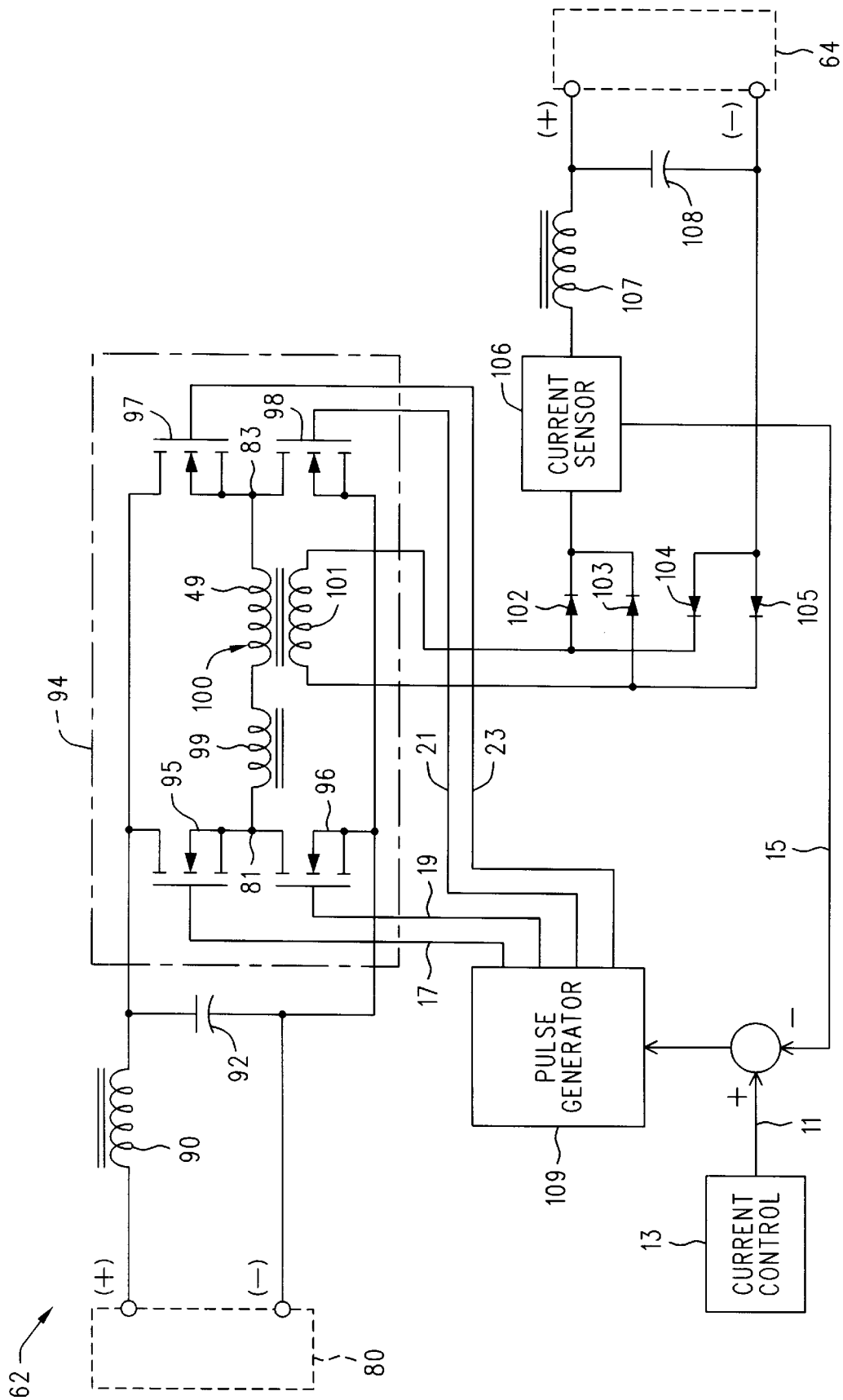
FIG. 6 is a schematic representation of one embodiment of a servo control circuit for producing the modulated output signal shown in FIG. 4.

Referring specifically to FIG. 6, the servo control circuit 62 may comprise a first inductor or choke 90 and a first capacitor 92 connected in series across the positive (+) and negative (−) terminals of the rectifier circuit 80. See also FIG. 1. The first choke 90 and first capacitor 92 add inductive and capacitive reactance to the circuit and help dampen the power fluctuations resulting from the operation of the phase shift converter circuit 94. The values of the first inductor or choke 90 and the first capacitor 92 are not particularly critical and any of a wide range of values may be suitable depending on the design voltage and power levels of the particular power supply 36, as well as on other extrinsic considerations. Accordingly, the present invention should not be regarded as limited to any particular values or ranges of values for the choke 90 and capacitor 92. By way of example, in one preferred embodiment the choke 90 may have an inductance in the range of about 0.3 millihenrys (mH) to 100 mH (1 mH preferred), and the capacitor 92 may have a capacitance in the range of about 100 microfarads ($\mu$F) to 10,000 $\mu$F (1500 $\mu$F preferred).

A converter circuit 94 is connected across the first capacitor 92 and comprises a first pair of switching devices 95, 96 connected across capacitor 92 and a second pair of switching devices 97, 98 connected in parallel with the first pair of switching devices 95, 96. A second choke 99 and the primary winding 49 of a transformer 100 are connected in series across circuit node 81 (located between the first and second switching devices 95 and 96) and circuit node 83 (located between the third and fourth switching devices 97 and 98). The converter circuit 94 allows the voltage and current produced by the rectifier circuit 80 to be controlled as necessary to produce the modulated output signal 66 (FIGS. 4 and 5). The converter circuit 94 also provides other advantages, as will be described in greater detail below.

The secondary winding 101 of transformer 100 is connected across a diode bridge formed by diodes 102, 103, 104, and 105. A third choke 107 and a second capacitor 108 are connected in series across the DC side of the diode bridge, i.e., between the cathodes of diodes 102 and 103 and the anodes of diodes 104 and 105. The positive (+) and negative (−) output terminals are connected across the second capacitor 108. The positive (+) and negative (−) output terminals may be connected to the polarity reversing circuit 64. Alternatively, if no polarity reversing circuit 64 is used, then the positive (+) and negative (−) output terminals may be connected directly to the anode (e.g., vacuum chamber 18) and cathode/target assembly 20, respectively. A current sensor 106 connected between third choke 107 and the cathodes of diodes 102 and 103 senses the average output current of the servo control circuit 62. The function of the current sensor 106 will be described in greater detail below.

The values for the various components described above are not particularly critical and may vary depending on the particular application and circuit design, as well as other extrinsic factors. Consequently, the present invention should not be regarded as limited to any particular values or ranges of values for the various components. However, by way of example, in one preferred embodiment wherein the voltage across the output terminals of the rectifier circuit 80 is in the range of about 100 volts to about 1,000 volts and wherein the expected output power of the power supply 36 is expected to be in the range of about 1 kilowatt (kw) to about 15 kw, the third choke 107 should have an inductance in the range of about 0.1 millihenrys (mH) to about 1 mH (0.3 mH preferred) and the second capacitor 108, a capacitance in the range of about 0.1 microfarads ($\mu$F) to about 100 $\mu$F (1.0 $\mu$F preferred). The transformer 100 may have a turns ratio commensurate with the voltage produced by the rectifier circuit 80 and the desired output voltage. In one preferred embodiment, the transformer 100 has a turns ratio of 6:28. That is, the primary winding 49 comprises 6 turns, whereas the secondary winding 101 comprises 28 turns. Alternatively, other turns ratios could also be used. The rectifying diodes 102, 103, 104, and 105 should be rated at 1,200 volts and 30 amperes. The current sensor 106 may comprise a model no. LT-100P current sensor available from LEM, USA of Milwaukee, Wis., although other devices could also be used.

In one preferred embodiment, the switching devices 95, 96, 97, and 98 of the converter circuit 94 comprise MOSFETs rated at 500 V and 71 A, such as type APT50M60JN available from Advanced Power Technology, Inc., of Bend, Oreg. Alternatively, other types of switching devices may also be used, provided such devices are capable of switching the anticipated voltages and currents at the speeds required.

Each of the switching devices 95, 96, 97, and 98 are connected to a pulse generator 109 which produces output signals suitable for switching each of the switching devices 95, 96, 97, and 98 between a non-conducting or open state and a conducting or closed state. Pulse generator 109 controls the various switching devices 95, 96, 97, and 98 based on a current control signal 11 (which may be provided by a suitable control circuit 13) and an average current feedback signal 15 (which is provided by current sensor 106). Specifically, the pulse generator 109 produces a plurality of control signals 17, 19, 21, and 23 which control the respective switching devices 95, 96, 97, and 98. The control signals 17, 19, 21, and 23 are phase shifted with respect to one another to allow each of the switching devices 95, 96, 97, and 98 to be switched between the conducing and non-conducting states when the potential across each respective switching device is substantially zero volts. Such zero voltage switching minimizes power losses due to dissipation within the various switching devices 95, 96, 97, and 98.

While such zero voltage switching methods are well-known in the art and could be easily implemented by persons having ordinary skill in the art after having become familiar with the details of this invention, the zero voltage switching method used in one preferred embodiment will now be briefly described in order to provide a better basis for understanding the advantages of the servo control circuit 62 as they relate to the film deposition method and apparatus 10 according to the present invention.

Basically, the zero voltage switching method of servo control circuit 62 involves the out-of-phase (i.e., phase-shifted) switching of the switching devices 95, 96, 97, and 98. That is, instead of driving both of the diagonal switching devices (e.g., 95 and 98 or 96 and 97) together, in phase, the diagonal switching devices are turned on and off in a phase-shifted manner. Thus, only one of the diagonal switches is on before the other is activated.

Figure 7:
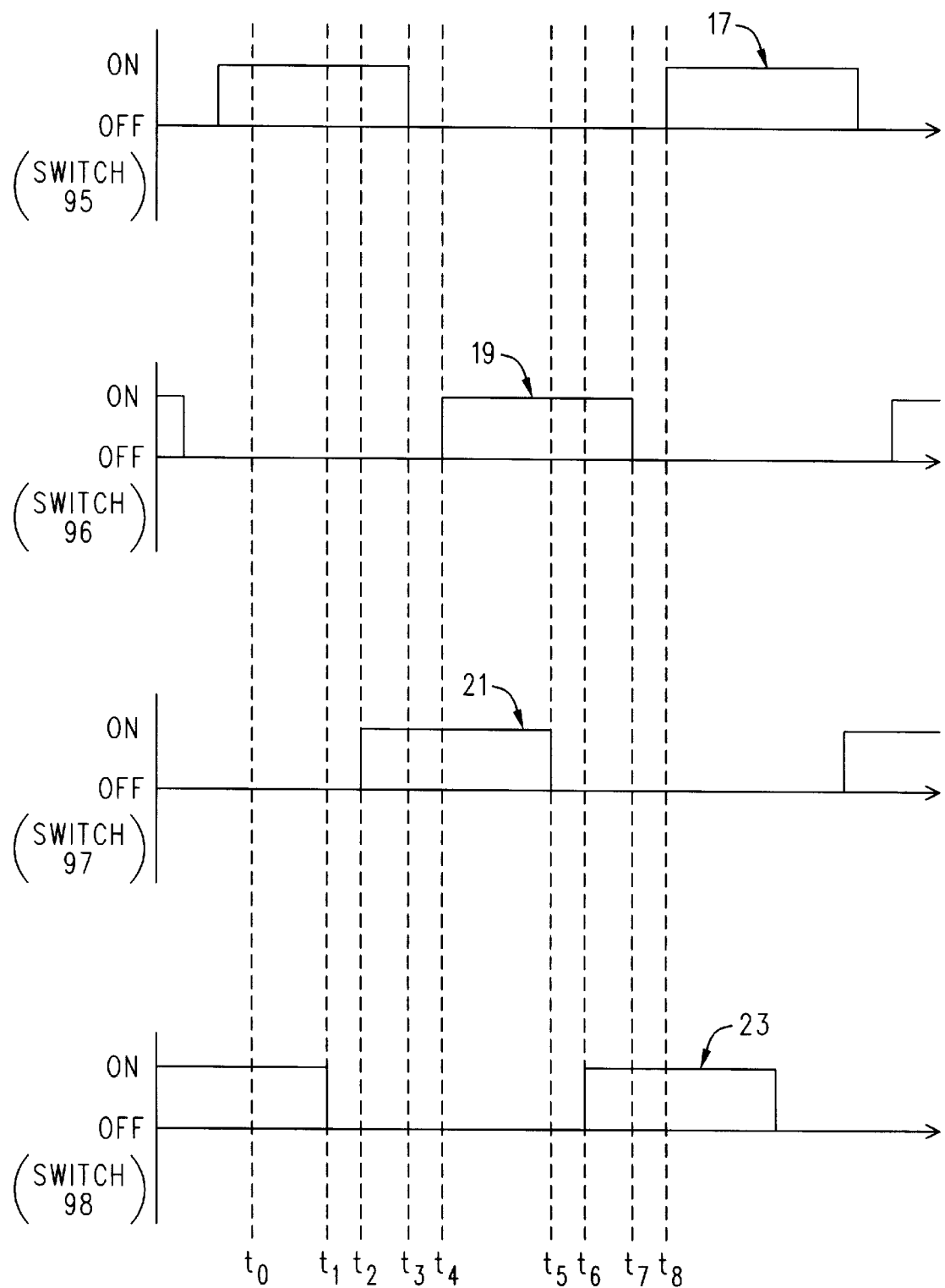
FIG. 7 is a graphical representation of the phase-shifted control signals used to actuate the various switching devices comprising the servo control circuit.

The operation of the converter circuit 94 may be better understood by considering a hypothetical example. Referring now to FIG. 7, the converter circuit 94 is operated by the various control signals 17, 19, 21, and 23 which are used to control the switching devices 95, 96, 97, and 98, respectively. At a time $t_0$, both control signals 17 and 23 (which control switching devices 95 and 98, respectively) are "on" (i.e., switching devices 95 and 98 are both conducting), while both diagonal switching device control signals 19 and 21 (which control switching devices 96 and 97) are "off," (i.e., switching devices 96 and 97 are non-conducting). Then, at a time $t_1$, control signal 23 (i.e., switching device 98) is turned off, however control signal 17 (i.e., switch 95) is still "on." A short time later ($t_2$), while control signal 17 (i.e., switch 95) is still on, control signal 21 (i.e., switch 97) is turned on. Switches 95 and 97 both remain on for a time before control signal 17 (i.e., switch 95) is turned off at time $t_3$. Then, a short time later, at time $t_4$, control signal 19 (i.e., switch 96) is turned on, so that both diagonal switches (i.e., 96 and 97) are turned on. At time $t_5$, control signal 21 (i.e., switch 97) is turned off, leaving on only switch 96. Again, after a short time, at time $t_6$, control signal 23 (i.e., switch 98) is again turned on. Switches 96 and 98 both remain on for a short time before control signal 19 (i.e., switch 96) is turned off at $t_7$. Finally, control signal 17 (i.e., switch 95) is again turned on at time $t_8$ and the cycle is repeated.

The foregoing phase shifted switching method allows two of the switching devices in series with the primary winding 49 of transformer 100 to be on while the applied voltage to the primary winding 49 is zero, thus facilitating the zero voltage switching of the switching devices 95, 96, 97 and 98. One advantage of the zero voltage switching technique is that it minimizes the power dissipation in the switching devices. Another advantage is that the zero voltage switching technique is that it eliminates the "pulse stretching" phenomenon that is typically associated with conventional pulse width modulated converter circuits. That is, in conventional pulse width modulated converter circuits, extraneous capacitance introduced by the switching devices and other circuit elements slows the decay of the pulse, thus lengthening or "stretching" the length (i.e., time duration) of the pulse beyond the desired turn-off time. Consequently, conventional pulse width modulated converter circuits will not generally be capable of the relatively fast turn-on and turn-off times required by the film deposition method and apparatus of the present invention.

To sum up, the phase-shifted method of operating the converter circuit 94 allows superior control of the output pulse width, which allows for the more precise control of the plasma process occurring in chamber 18, particularly at higher plasma impedances and at lower minimum power levels. The phase-shifted converter circuit 94 also allows the modulated output signal 66 to be produced which has a turn-on time 84 (FIGS. 4 and 5) that meets the parameters set forth above.

The phase-shifted control technique set forth above may be provided relatively easily by the pulse generator 109. In one preferred embodiment, the pulse generator 109 may comprise a model no. UC3875 pulse generator available from Unitrode Integrated Circuits Corporation of Merrimack, N.H., which is specifically designed for phase-shifted control. Alternatively, other pulse generators could also be used.

Another significant feature of the servo control circuit 62 is that converter circuit 94 is controlled based on the average current output of the circuit, as sensed by the current sensor 106. Most conventional plasma power supply circuits embody two or more current and/or voltage feedback loops in order to control the output signal. The single average current feedback loop associated with the circuit topology shown and described herein substantially reduces the response time of the servo control circuit 62, which again affords superior control over the modulated output signal 66, thus the plasma process being carried out in chamber 18.

The polarity reversing circuit 64 used in one preferred embodiment may comprise the polarity reversing circuit described in U.S. patent application Ser. No. 08/667,417, filed on Jun. 21, 1996, now U.S. Pat. No. 5,682,067, which is incorporated herein by reference for all that it discloses. However, in order to provide a better basis for understanding the present invention, the polarity reversing circuit described in the aforementioned patent will now be briefly described.

Figure 8:
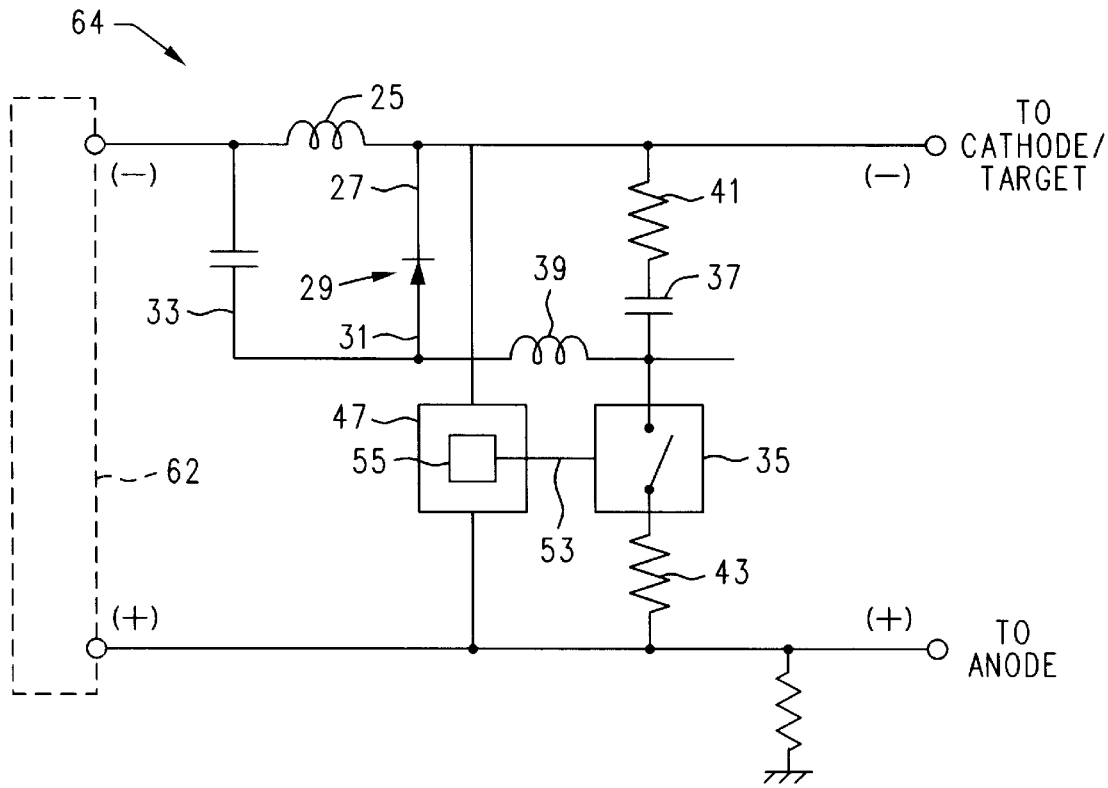
FIG. 8 is a schematic representation of one embodiment of a polarity reversing circuit for producing the plurality of polarity reversal signals.

Referring now to FIG. 8, the polarity reversing circuit 64 may comprise a first inductor 25 connected in series between the negative (−) terminal of the output of the servo control circuit 62 and the cathode/target assembly 20. The first inductor 25 adds a substantial amount of reactance to the circuit, thereby allowing the plasma process to operate at substantially constant current, at least for short term transient impedance variations likely to occur in the plasma 38 (FIG. 1). The amount of inductance of the first inductor 25 is not particularly critical, and it is only necessary to provide sufficient inductance to allow the plasma process to be operated at substantially constant current for the typically expected transient impedance variations in the plasma 38. By way of example, the first inductor 25 may have an inductance of about 1.5 millihenries (mH), although other inductances may also be used.

The cathode 27 of a diode 29 is also connected to the cathode/target assembly 20, whereas the anode 31 of diode 29 is connected to one plate of a first capacitor 33. The other plate of first capacitor 33 is connected to the negative (−) terminal of the servo control circuit 62. The series arrangement of the first capacitor 33 and diode 29 forms a voltage limiter or clamp to prevent excessive negative voltages from being imposed on the cathode/target assembly 20 when the switching device 35 is opened. The size of diode 29 will, of course, depend on the capacity of the particular power supply 36, the expected peak voltages and currents, as well as the values chosen for the other components in the circuit 36. However, in one preferred embodiment, the diode 29 may comprise a single diode rated for 800 volts (V) and 6 amperes (A). Alternatively, a combination of diodes may be used, as would be obvious to persons having ordinary skill in the art.

The value of the first capacitor 33 must be selected so that it will not discharge significantly during the longest conducting period of switching device 35 at the maximum load current, i.e., the duration 88 of each pulse 86 (FIG. 5). Further, the LC resonant circuit that comprises the first and second capacitors 33 and 37 and the second inductor 39 should have a sufficiently long time constant so that the second capacitor 37 will be positively charged when the switching device 35 is again switched to the conducting state. The range of values for the first capacitor 33 will be described later.

The second capacitor 37 and the switching device 35 are connected in series across the cathode/target assembly 20 and the anode (e.g., the chamber 18). It is preferred, but not required, that a first resistor 41 be connected in series between the capacitor 37 and the cathode/target assembly 20, and a second resistor 43 be connected in series between the switching device 35 and the anode (e.g., chamber 18). Although both resistors 41 and 43 act as current limiters to protect their associated components, resistor 43 also provides current limiting information to the switch actuation circuit 47. In one preferred embodiment, the first resistor 41 may have a value in the range of 1 ohm (Ω) to 50 Ω (8Ω preferred). The second resistor 43 may have a value in the range of 10 milliohms (mΩ) to 100 mΩ (50 mΩ preferred). Finally, the second inductor 39 is connected between the first and second capacitors 33 and 37, respectively.

The first and second capacitors 33 and 37, along with the second inductor 39, form an LC resonant circuit. In order to provide good performance, the time constant of the resonant circuit should be selected so that it is at least four (4) times longer than the expected length of the non-conducting period of switching device 35 (i.e., the period 51 between adjacent pulses 86, FIG. 5) at the slowest cycle rate. It is preferred, but not required, that the time constant of the LC resonant circuit be about one (1) order of magnitude (i.e., about 10 times) longer than the length of the non-conducting period (i.e., 51). Thus, in one preferred embodiment having a non-conducting time period 51 in the range of 20–60 microseconds ($\mu$s), the time constant of the resonant circuit should be selected to be about 600 $\mu$s. Therefore, any values for the second inductor 39 and the first and second capacitors 33 and 37 that will yield such a time constant usually will suffice. In one preferred embodiment, the first capacitor 33 has a value in the range of about 1 microfarad ($\mu$F) to 10 $\mu$F (1 $\mu$F preferred), the second capacitor 37 a value in the range of 1 $\mu$F to 10 $\mu$F (1 $\mu$F preferred), and the inductor 39 has a value of about 5 millihenries (mH) to 10 mH (10 mH preferred).

The switching device 35 may comprise any number of semiconductor switching devices suitable for switching the anticipated currents at a suitable speed (e.g., 0.1 $\mu$s). Examples of such semiconductor switching devices include, but are not limited to, bi-polar transistors, insulated gate bi-polar transistors (IGBTs), field-effect transistors (FETs), metal-oxide semiconductor field-effect transistors (MOSFETs), etc., that are readily commercially available and well-known to persons having ordinary skill in the art. Alternatively, non-semiconductor switching devices may also be used, provided such devices are capable of switching the anticipated voltages and currents at the speeds required. In one preferred embodiment, the switching device 35 may comprise an insulated gate bi-polar transistor of the type which are readily commercially available.

The switch actuation circuit 47 may comprise any of a number of circuits well-known in the art for periodically actuating the switching device 35 to change it from a non-conducting state to a conducting state. In one preferred embodiment, the switch actuation circuit 47 accomplishes the actuation of switching device 35 by applying the appropriate base current to the IGBT transistor comprising switching device 35 to switch it from a non-conducting state to a conducting state at the desired time intervals. That is, the switch actuation circuit 47 should be designed to provide a switch actuation signal 53 to the switching device 35 at any of a range of frequencies suitable for providing an acceptable level of arc suppression for the particular plasma process being performed. In one preferred embodiment adapted for a non-reactive sputter deposition process, the switch actuation circuit 47 activates (i.e., closes) the switching device 35 for about 2–5 $\mu$s (i.e., the duration 88 of the reverse polarity cycle 86 shown in FIG. 5), at a frequency of about 50 kilohertz (kHz), although other durations 88 and frequencies could also be used.

Figure 9:
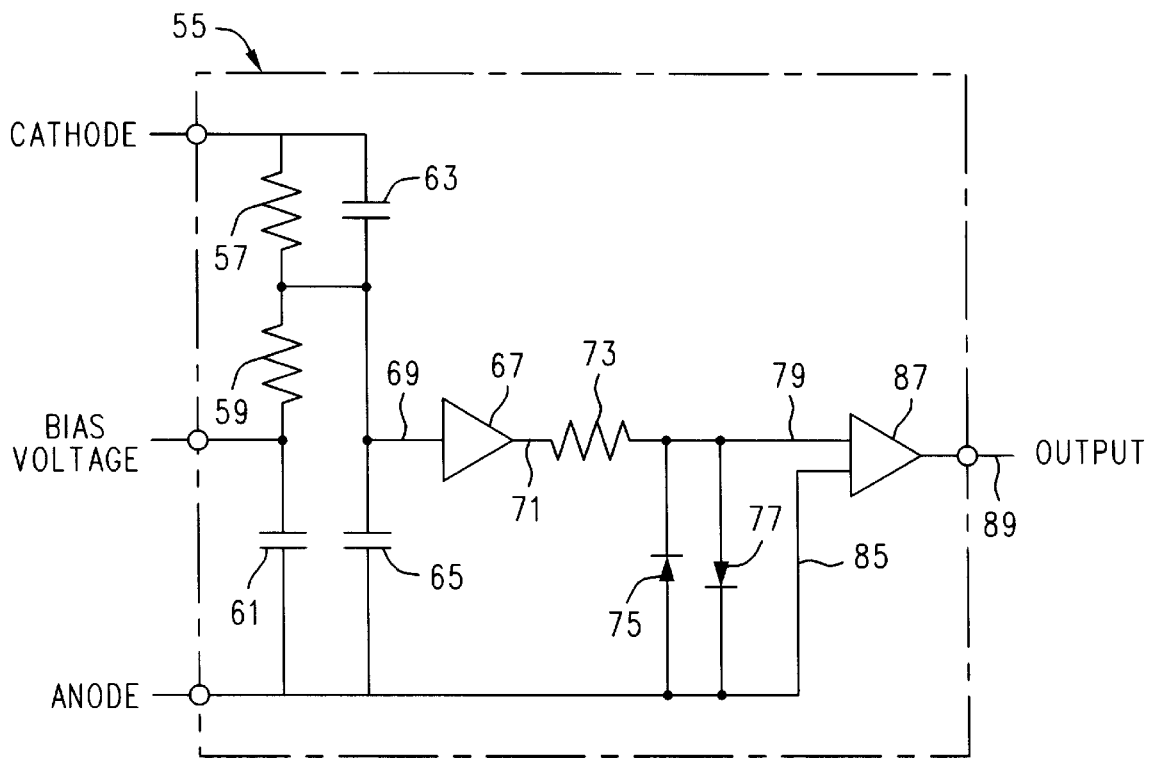
FIG. 9 is a schematic representation of one embodiment of an arc detection circuit that may be associated with the polarity reversing circuit shown in FIG. 8.

In certain circumstances, it may be advantageous to enhance the arc suppression capabilities of the power supply circuit 36 described above by connecting an arc detection circuit 55 to the switch actuation circuit 47. The arc detection circuit 55 works in concert with the normal operation of the switch actuation circuit 47 to reverse the voltage potential on the cathode/target assembly 20 if an arc condition is detected during the time when the switching device 36 is in the non-conductive (i.e., open) state (e.g., during the time 51 between two successive pulses 86). While many different kinds of arc detection devices are known and may be used with the present invention, one preferred embodiment of the present invention uses an arc detection circuit 55 substantially as shown in FIG. 9.

Essentially, arc detection circuit 55 may comprise first and second resistors 57 and 59 connected in series with a first capacitor 61 across the cathode and anode (e.g., the cathode/target assembly 20 and the chamber 18). See FIG. 1. A second capacitor 63 is connected in parallel with the first resistor 57. A third capacitor 65 is connected in series with the second capacitor 63 so that it is also connected in parallel with the series arrangement of resistor 59 and capacitor 61. The combination of resistors 57, 59 and capacitors 63 and 65 form a compensated voltage divider network which provides to the buffer amplifier 67 a reduced-voltage signal 69 that more accurately represents the actual voltage signal (i.e., wave-form) on the cathode (i.e., cathode/target assembly 20) and anode (i.e., chamber 18), than is possible with conventional, purely resistive voltage divider networks. A bias voltage is applied to resistor 59 to define the voltage level at which an arc is to be recognized. That is, an arc condition is assumed to exist and is recognized by the arc detection circuit 55 if the voltage potential between the electrodes starts to decrease and passes through a defined voltage level. The defined voltage level can be varied by adjusting the magnitude of the bias voltage applied to resistor 59.

The reduced voltage signal 69 from the compensated voltage divider network is then fed into buffer amplifier 67. The output signal 71 from buffer amplifier 67 is fed via resistor 73 to a diode clamp circuit comprising diodes 75 and 77. Under normal circumstances, the output signal 71 from buffer amplifier 67 will be negative. Hence, current will flow via resistor 73 and diode 75 and a negative clamped voltage of about 0.6 volts will appear across the input leads 79 and 85 of comparator 87. Conversely, if the output signal 71 from amplifier 67 goes positive, diode 77 will conduct, again imposing a clamped voltage of about 0.6 volts across input leads 79 and 85 of comparator 87. The arrangement of diodes 75 and 77, along with resistor 73, forms a non-linear voltage divider network which substantially reduces the input impedance presented to the input of comparator 87, thus removing a substantial amount of the RF (i.e., radio frequency) noise present in the output signal 71. The comparator 87 produces an output signal 89 when the voltage across its input leads 79, 85 passes through zero. The output signal 89 from comparator 87 may then be fed into the switch actuation circuit 47 to trigger the switching device 35. It should be noted that in this application it will be desirable to design the arc detection circuit 55 so that it will ignore the low voltage on the cathode (i.e., cathode/target assembly 20) if the low voltage occurs during the normal reverse polarity cycle 86 of the switch actuation circuit 47, i.e., during normal pulsing.

Before proceeding with the description of the operation of the film deposition apparatus 10 according to the present invention, it is useful to first define certain terms commonly used in the field of plasma processing and that are used herein. The term "plasma" (or, alternatively, "glow discharge") is usually defined as a region of high temperature gas containing large numbers of free electrons and ions. When used in the context of plasma processing technology, some persons consider the "plasma" as extending throughout the entire chamber. Others, however, consider the plasma as limited substantially to the region of the "glow discharge" (generally located adjacent the surface of the cathode/target) since the glow discharge region is readily visually discernable. As used herein, the term "plasma" shall mean the latter of the two definitions. That is, the term "plasma" shall refer to the region substantially coincident with the glow discharge.

The film deposition apparatus 10 according to the present invention may be operated as follows to deposit the film 12 onto the surface 14 of substrate 16. Assuming that proper pressure and atmosphere have been established within the chamber 18, the sputter deposition process (i.e., either non-reactive or reactive) may be initiated by activating the power supply 36. Upon activation, power supply 36 places the modulated output signal 66 on the cathode/target assembly 20. During the negative pulse or period 68, an electric field is established between the cathode/target assembly 20 and the anode (e.g., chamber 18) which initiates or "ignites" the plasma 38. In accordance with the foregoing definition, the plasma 38 is coincident with the glow discharge and is located adjacent the cathode/target assembly 20. Positively charged ions (not shown) contained in the plasma 38 are drawn to the negatively charged cathode/target assembly 20. Some of the incoming ions have sufficient energy to dislodge or sputter atoms of the target material. The sputtered atoms migrate through the interior 32 of the process chamber 18 and condense on various objects contained within the chamber, including the surface 14 of substrate 16, whereupon they form the film 12. When the modulated output signal 66 enters the quiescent period 70, the plasma 38 is extinguished, which terminates the sputtering process. Consequently, substantially no material is transferred from the target 42 to the substrate 16 during the quiescent period 70.

As was briefly described above, there is no significant activity that occurs on the cathode/target 20 during the quiescent period 70, at least insofar as the properties of the film 12 are concerned. However, the same cannot be said with regard to the surface 14 of substrate 16. During the quiescent period, previously deposited atoms (i.e., adatoms) of the target material may be rearranging themselves on the surface 14 of substrate 16. This phenomenon is referred to herein as "surface mobility." The alternating sputtering process according to the present invention significantly increases the surface mobilities of the deposited adatoms over those which would be associated with the same apparatus but operating in a continuous manner, i.e., without a quiescent period 70.

The increased surface mobilities of the adatoms are due primarily to two factors: The quiescent period 70 and the higher energy adatoms typically associated with the present invention. The quiescent period 70 provides the adatoms with additional time migrate over the surface. Therefore, even though the adatoms may not posses significantly greater energies compared with those which would be associated with the same apparatus but operating without a quiescent period 70, the additional migration time afforded by the quiescent period 70 means that the adatoms will have generally greater surface mobilities. In fact, even relatively low-energy adatoms may have significantly greater surface mobilities as a result of the increased migration time afforded by the quiescent period 70.

The second factor that tends to increase the surface mobilities of the adatoms is that the adatoms produced by the present invention generally have relatively high energies. For example, the film deposition apparatus 10 according to the present invention may be operated at relatively high power levels during the active state which tends to produce adatoms of considerably higher energies. In fact, in one preferred embodiment, the film deposition apparatus 10 may be operated at power densities of about 400 watts per square inch of target surface area or higher, which is considerably greater than conventional film deposition apparatus. The higher energies of the adatoms produced by the present invention generally increases their surface mobilities.

While the precise nature and mechanisms relating to the growth of the film 12 are not yet fully understood, the increased adatom mobilities associated with the method and apparatus of the present invention provide operators with improved control of the process and the characteristics of the deposited film. For example, the increased adatom mobility associated with the present invention generally allows more adatoms to migrate to low energy sites where nucleation and growth occurs, thereby increasing the nucleation density in many instances. The increased nucleation density may promote more interfacial reactions, thereby improving adhesion.

The increased mobility also provides increased operator control over film morphology. For example, if the film deposition apparatus 10 is operated at relatively high powers (e.g., 400 watts/in$^2$) during the negative pulses or periods 68, the energies of the adatoms will be proportionally higher. The increased adatom energy, combined with the increased migration times afforded by the quiescent periods 70 generally results in the formation of relatively high density films free of the columnar type microstructures typically associated with prior high deposition rate processes. Put in other words, films produced by the present invention will tend to have improved surface coverage with a consequent reduction in the number of interfacial voids which may result in the easy fracture and poor adhesion of the film. Such increased film density may be reflected in film properties such as better corrosion resistance, lower chemical etch rate, higher hardness, lower electrical resistivity (in metals), and increased index of refraction for optical coatings.

If the film deposition method and apparatus according to the present invention are used to perform reactive sputter deposition, then the quiescent period 70 provided by the present invention will provide additional time for the reactive species to diffuse to the regions where the reactions are taking place between the sputtered species and the reactive species. The increased diffusion time will result in improvements in film chemistry and other film parameters.

It is contemplated that the inventive concepts herein described may be variously otherwise embodied and it is intended that the appended claims be construed to include alternative embodiments of the invention except insofar as limited by the prior art.

What is claimed is:

1. Apparatus for depositing a film of material on a substrate, comprising:

sputter deposition apparatus for transferring target atoms from a target to the substrate;

a servo control circuit operatively associated with said sputter deposition apparatus, wherein said servo control circuit operates said sputter deposition apparatus in an alternating manner between an "active" state and a "quiescent" state, wherein target atoms are transferred from the target to the substrate during the "active" state and wherein substantially no target atoms are transferred from the target to the substrate during the "quiescent" state, said servo control circuit operating said sputter deposition apparatus so that a power density on the target during the "active" state is at least about 400 watts per square inch of target area; and a polarity reversing circuit operatively associated with said servo control circuit, wherein said polarity reversing circuit periodically reverses a polarity on the sputter deposition apparatus more than once during the "active" state.

2. The apparatus of claim 1, wherein said servo control circuit operates said sputter deposition apparatus in the "active" state for a duration in the range of about 0.5 milliseconds to about 10 milliseconds and wherein said servo control circuit operates said sputter deposition apparatus in the "quiescent" state for a duration in the range of about 0.5 milliseconds to about 50 milliseconds.

3. The apparatus of claim 2, wherein said polarity reversing circuit reverses the polarity on said sputter deposition apparatus at a frequency in the range of about 20 kHz to about 80 kHz.

4. The apparatus of claim 3, wherein said polarity reversing circuit reverses the polarity on said sputter deposition apparatus for a duration in the range of about 2 microseconds to about 5 microseconds.

5. The apparatus of claim 4, wherein said sputter deposition apparatus comprises a cathode and an anode.

6. The apparatus of claim 5, wherein said servo control circuit provides a negative potential on the cathode with respect to the anode when said sputter deposition apparatus is in the "active" state and removes the negative potential on the cathode when said sputter deposition apparatus is in the "quiescent" state.

7. The apparatus of claim 6, wherein said servo control circuit places said sputter deposition apparatus in the "active" state from the "quiescent" state in a turn-on time that is less than about 200 microseconds.

8. The apparatus of claim 7, wherein the turn-on time is in the range of about 5 microseconds to about 200 microseconds.

9. The apparatus of claim 8, wherein said servo control circuit places said sputter deposition apparatus in the "quiescent" state from the "active" state in a turn-off time that is less than about 200 microseconds.

10. The apparatus of claim 9, wherein the turn-off time is in the range of about 5 microseconds to about 200 microseconds.

11. Apparatus for depositing a film of material on a substrate, comprising:
   sputter deposition apparatus for transferring target atoms from a target to the substrate, said sputter deposition apparatus including a cathode and an anode;
   a servo control circuit operatively associated with said sputter deposition apparatus, wherein said servo control circuit operates said sputter deposition apparatus in an alternating manner between an "active" state and a "quiescent" state, wherein target atoms are transferred from the target to the substrate during the "active" state and wherein substantially no target atoms are transferred from the target to the substrate during the "quiescent" state, said servo control circuit operating said sputter deposition apparatus in the "active" state for a duration in the range of about 0.5 milliseconds to about 10 milliseconds and operating said sputter deposition apparatus in the "quiescent" state for a duration in the range of about 0.5 milliseconds to about 50 milliseconds, said servo control circuit operating said sputter deposition apparatus so that a power density on the target during the "active" state is at least about 400 watts per square inch of target area; and
   a polarity reversing circuit operatively associated with said servo control circuit, wherein said polarity reversing circuit periodically reverses a polarity on the sputter deposition apparatus more than once during the "active" state at a frequency in the range of about 20 kHz to about 80 kHz.

12. A method for depositing a film of material on a substrate, comprising the steps of:
   providing sputter deposition apparatus for transferring target atoms from a target to the substrate;
   operating the sputter deposition apparatus in an alternating manner between an "active" state and a "quiescent" state so that a power density applied to the target during the "active" state is at least about 400 watts per square inch of target area, wherein target atoms are transferred from the target to the substrate during the "active" state and wherein substantially no target atoms are transferred from the target to the substrate during the "quiescent" state; and
   periodically reversing a polarity on the sputter deposition apparatus more than once during the "active" state.

13. The method of claim 12, wherein a duration of the "active" state is in the range of about 0.5 milliseconds to about 10 milliseconds and wherein a duration of the "quiescent" state is in the range of about 0.5 milliseconds to about 50 milliseconds.

14. The method of claim 13, wherein the polarity on the sputter deposition apparatus is reversed during the "active" state at a frequency in the range of about 20 kHz to about 80 kHz.

15. The method of claim 14, wherein the polarity on the sputter deposition apparatus is reversed for a duration in the range of about 2 microseconds to about 5 microseconds.

16. A method for depositing a film of material on a substrate, comprising the steps of:
   providing sputter deposition apparatus for transferring target atoms from a target to the substrate;
   operating the sputter deposition apparatus in an alternating manner between an "active" state and a "quiescent" state so that a power density applied to the target during the "active" state is at least about 400 watts per square inch of target area, wherein a duration of the "active" state is in the range of about 0.5 milliseconds to about 10 milliseconds and wherein a duration of the "quiescent" state is in the range of about 0.5 milliseconds to about 50 milliseconds, wherein target atoms are transferred from the target to the substrate during the "active" state and wherein substantially no target atoms are transferred from the target to the substrate during the "quiescent" state; and
   periodically reversing a polarity on the sputter deposition apparatus more than once during the "active" state at a frequency in the range of about 20 kHz to about 80 kHz, and wherein the polarity on the sputter deposition apparatus is reversed for a duration in the range of about 2 microseconds to about 5 microseconds.

17. Apparatus for depositing a film of material on a substrate, comprising:
   sputter deposition apparatus for transferring target atoms from a target to the substrate;
   a servo control circuit operatively associated with said sputter deposition apparatus, wherein said servo control circuit operates said sputter deposition apparatus in an alternating manner between an "active" state and a "quiescent" state, wherein target atoms are transferred from the target to the substrate during the "active" state and wherein substantially no target atoms are transferred from the target to the substrate during the "quiescent" state; and
   a polarity reversing circuit operatively associated with said servo control circuit, wherein said polarity reversing circuit periodically reverses a polarity on the sputter deposition apparatus more than once during the "active" state.

* * * * *